United States Patent [19]
Tokura

[11] Patent Number: 5,105,149
[45] Date of Patent: Apr. 14, 1992

[54] APPARATUS FOR INSPECTING ELECTRONIC DEVICES MOUNTED ON A CIRCUIT BOARD

[75] Inventor: Nobufumi Tokura, Fukuoka, Japan

[73] Assignee: Matsushita Electric Industrial Co., Ltd., Osaka, Japan

[21] Appl. No.: 553,206

[22] Filed: Jul. 13, 1990

[30] Foreign Application Priority Data

Jul. 17, 1989 [JP] Japan ................................. 1-184080

[51] Int. Cl.⁵ ..................... G01R 31/01; G01N 21/88
[52] U.S. Cl. .................... 324/158 R; 324/158 F; 324/158 D; 358/106
[58] Field of Search ............. 324/158 R, 158 D, 73.1, 324/500, 501; 358/106, 101; 382/8; 356/237, 394; 364/559

[56] References Cited

U.S. PATENT DOCUMENTS

| | | | |
|---|---|---|---|
| 4,028,728 | 6/1977 | Sharp | 358/106 |
| 4,772,125 | 9/1988 | Yoshimura et al. | 358/106 |
| 4,863,268 | 9/1989 | Clarke et al. | 358/106 |
| 4,872,052 | 10/1989 | Liudzius et al. | 358/106 |

FOREIGN PATENT DOCUMENTS

64-79874  3/1989  Japan .

Primary Examiner—Kenneth A. Wieder
Assistant Examiner—Vinh P. Nguyen
Attorney, Agent, or Firm—Panitch, Schwarze, Jacobs & Nadel

[57] ABSTRACT

An apparatus for inspecting electronic devices mounted on a circuit board is disclosed. The apparatus includes: a camera for forming an image of a view of an electronic device to be inspected; a laser device for emitting laser light toward the device to be inspected; a laser light detector for detecting a laser beam reflected from the device to be inspected; and a control unit for inspecting the condition of mounting the device to be inspected on the circuit board based on data obtained from the camera and the laser detector. Rough inspections are performed first by the camera which can rapidly perform the inspection, and then only failing devices are inspected by the combination of the laser device and detector which is capable of precisely measuring the solder shape. Therefore, visual inspection for various items is performed at an overall faster rate while maintaining the required inspection level.

6 Claims, 4 Drawing Sheets

Fig. 2

| | | SOLDER CONDITION | IMAGE |
|---|---|---|---|
| (a) | TOP HORN-LIKE (CAPACITOR) | | |
| (b) | TOP HUMP-LIKE (CAPACITOR) | | |
| (c) | TOP POOR WETTING (NOT CONTACTED) (CAPACITOR) | | |
| (d) | TOP TOMBSTONING (MANHATTAN) (CAPACITOR) | | |
| (e) | TOP POOR WETTING (NOT CONTACTED) (TRANSISTOR) | | |
| (f) | SIDE NORMAL FILLET (QFP) | | |
| (g) | SIDE NORMAL FILLET (PLCC) | | |

■ : DARK   ▒ : SLIGHTLY BRIGHT   □ : BRIGHT

EXCESS SOLDER
Hx > H1 = 1.5 Ht

INSUFFICIENT SOLDER
Hx < H2 = 0.5 Ht

FILLET ANGLE : NG
$\theta x < \theta f = 20$

APPARATUS FOR INSPECTING ELECTRONIC DEVICES MOUNTED ON A CIRCUIT BOARD

BACKGROUND OF THE INVENTION

1. Field of the Invention

This invention relates to an apparatus for inspecting electronic devices mounted on a circuit board, and more particularly to an apparatus for performing a visual inspection of the condition of mounting an electronic device on a circuit board.

2. Description of the Prior Art

Various apparatus for inspecting an electronic device mounted on a cricuit board for positional deviation, lifting, solder condition, etc. have been proposed. A typical example of such apparatus is proposed in Japanese Laid-Open Patent Publication (Kokai) No. Heisei 1(1989)-79874. This apparatus comprises an upper or top camera for observing the electronic parts from a perpendicular direction above and a plurality of side cameras each for observing from an angle above, so that the upper camera can inspect deviation in position of the electronic devices, missing devices, etc., and the side cameras can inspect the degree of lift of the electronic devices from the circuit board.

The prior art apparatus comprising a combination of the upper camera and side cameras as described above has many advantages: it can inspect a wide area of a circuit board at one time; it can perform a relatively large number of inspection items; and its inspection speed is fast. Since the cameras can only detect two-dimensional planar data and not height data, however, this apparatus cannot perform special kinds of visual inspection items such as recognition of the shape of solder fillets which requires precise height data.

SUMMARY OF THE INVENTION

The apparatus of this invention, which overcomes the above-discussed and numerous other disadvantages and deficiencies of the prior art, is constructed for inspecting electronic devices mounted on a circuit board, and comprises: camera means for forming an image of a view of an electronic device to be inspected; laser light means for emitting laser light toward said device to be inspected; laser detection means for detecting a laser beam reflected from said device to be inspected; and control means for inspecting the condition of mounting said device to be inspected on said circuit board based on data obtained from said camera means and said laser detection means.

The apparatus of this invention comprises: first camera means for forming an image of the top view of an electronic device to be inspected; at least one second camera means each for forming an image of a side view of said device to be inspected; laser light means for emitting laser light toward said device to be inspected; laser detection means for detecting the height of at least one portion of said device to be inspected, on the basis of a laser beam reflected from said device to be inspected; and control means for inspecting the condition of mounting said device to be inspected on said circuit board based on data obtained from said first and second camera means and said laser detection means.

In the apparatus, said laser light means may emit laser light at least toward one or more solder portions where said device to be inspected is soldered to said circuit board, and said laser detection means may detect the height of at least one portion of said solder portions.

The apparatus of this invention comprises: first camera means for forming an image of the top view of an electronic device to be inspected, said first camera means being positioned perpendicularly above said device to be inspected; at least one second camera means each for forming an image of a side view of said device to be inspected, said second camera means being disposed diagonally above said device to be inspected; laser light means for emitting laser light toward said device to be inspected; laser detection means for detecting the height of at least one portion of said device to be inspected, on the basis of a laser beam reflected from said device to be inspected; and control means for inspecting the condition of mounting said device to be inspected on said circuit board based on data obtained from said first and second camera means and said laser detection means.

Said laser light means may emit laser light at least toward one or more solder portions where said device to be inspected is soldered to said circuit board, and said laser detection means may detect the height of at least one portion of said solder portions.

The apparatus may further comprise a height correction means for correcting the height of the portion of said circuit board where said device to be inspected is mounted.

The combination of said laser light means, laser detection means and control means may function as said height correction means, Thus, the invention described herein makes possible the objectives of:

(1) providing an apparatus for inspecting electronic devices mounted on a circuit board which can perform inspection items which requires precise height data; and (2) providing an apparatus for inspecting electronic devices mounted on a circuit board which can inspect the devices at a high speed.

BRIEF DESCRIPTION OF THE DRAWINGS

This invention may be better understood and its numerous objects and advantages will become apparent to those skilled in the art by reference to the accompanying drawings as follows:

FIG. 2 is a diagram illustrating various solder conditions.

DESCRIPTION OF THE PREFERRED EMBODIMENTS

Figure 1:
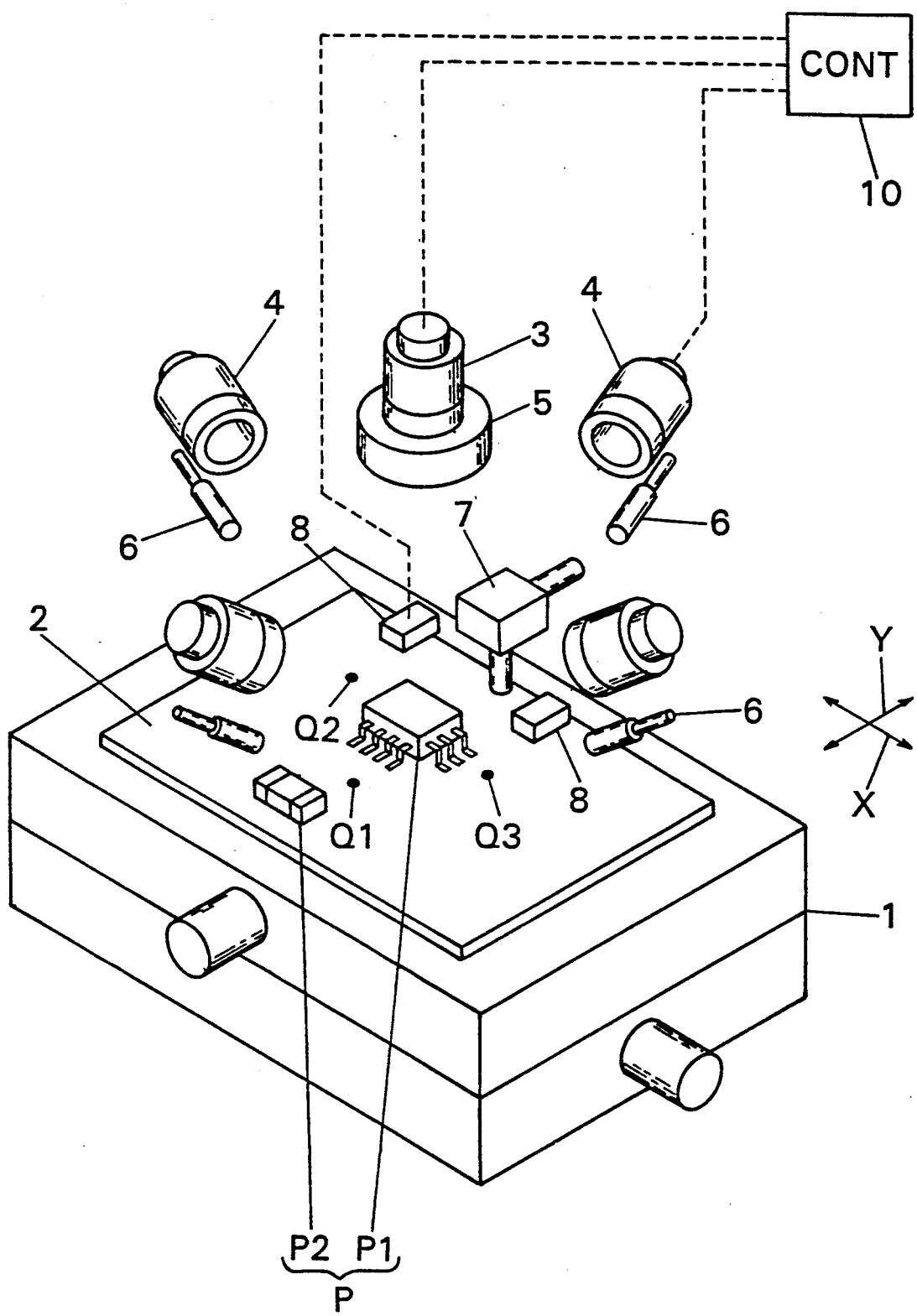
FIG. 1 is a perspective view of an apparatus according to the invention.

FIG. 1 shows an apparatus according to the invention. The apparatus of FIG. 1 comprises an X—Y table 1, an upper or top camera 3, four side cameras 4, a laser device 7, an optical sensor 8, and a control unit 10. The X—Y table 1 can move a circuit board 2 in the X and Y directions on which electronic devices P such as a quad flat pack (QFP) P1 and a capacitor P2 are mounted. The upper camera 3 and four side cameras 4 are provided above the the X—Y table 1. A ring-shaped upper light source 5 integrated with the upper camera 3, and side light sources 6 positioned below the side cameras 4 illuminate one of the electronic devices P (in FIG. 1, the QFP P1) from straight above and at an angle from above, respectively. The upper camera 3 observes the electronic device P to be inspected (e.g., QFP P1) perpendicularly from above. In contrast, the side cameras 4 observe the electronic device to be inspected at an angle from above. Thereby planar two-dimensional image data of the QFP P1 are obtained.

Figure 3:
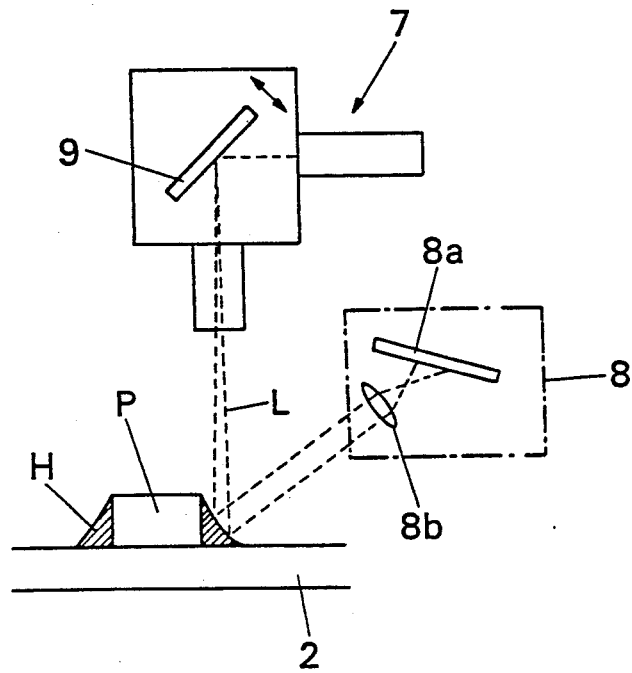
FIG. 3 shows diagrammatically the manner of measuring the height of solder fillets.

The laser device 7 and two optical sensors 8 are positioned above the circuit board 2. As shown in FIG. 3, the optical sensors 8 have a position detection element 8a such as a PSD (Position Sensitive Device), and a focusing element 8b. The position detection element 8a receives a laser beam L emitted by the laser device 7 and reflected from the electronic device P, so that height data regarding the device P is obtained by detecting the position of incidence of the laser beam L. The two optical sensors 8 are disposed at each of the both sides of the laser device 7 so that height data in the X or Y direction can be obtained from each sensor 8 while the circuit board 2 is moved in the X or Y direction. The laser device 7 has a built-in mirror 9, the angle of which is controlled so that the laser beam L can scan along a selected portion of the device P such as solder fillets H, etc.

The cameras 3 and 4 and the optical sensors 8 are connected to the control unit 10 having a computer. Based on data obtained from the cameras 3 and 4 and the optical sensor 8, the control unit 10 calculates the shape of the solder fillets H, and determine whether it passes or fails the inspections described below.

As mentioned above, the cameras 3 and 4 have wide inspection areas, can inspect for a relatively large number of items, and can inspect quickly. However, they can only detect two-dimensional planar data, and cannot measure height, so they cannot accurately measure the shape of solder fillets H. In order to overcome this drawback, the apparatus of the embodiment is provided with the laser device 7 which projects a finely focused laser spot on the electronic device P to be inspected, and also with the optical sensors 8 having the position detection element 8a which detects the reflected light, whereby it performs precise height measurement. Unlike the cameras 3 and 4, however, the combination of the laser device 7 and optical sensors 8 is unable to recognize two-dimensional data of a relatively wide area as one lump, and its inspection speed is slow. Therefore, this apparatus is constructed so that it can perform visual inspections of electronic devices with respect to many items, while selectively operating the cameras 3 and 4 and the combination of the laser device 7 and optical sensors 8 to compensate for their respectutve advantages and disadvantages.

Examples of the manner of inspecting electronic devices by the apparatus will be described. The conditions of mounting electronic devices as viewed from the top camera 3 are shown in (a) to (e) of FIG. 2, and (f) and (g) of FIG. 2 show those as viewed from the side cameras 4. The left column of FIG. 2 indicates the face to be inspected, the kind of the solder fillet defect, and the type of the electronic device to be inspected, and the center column diagrammatically shows the side view of the electronic device to be inspected, and the right column shows the image taken by the camera 3 or 4 (the solid area indicates the dark area in the image, and the dotted area the area of intermediate brightness). In the center column, the hatched portions indicate the solder H. The arrows in FIG. 2 indicate the directions of light emitted from the light sources 5 and 6 and then reflected from the solder fillets H.

In (a) of FIG. 2, when the upper light source 5 is turned on and observation is performed with the upper camera 3, the light irradiated on the normal solder fillet H on the left side is reflected toward the side, so the reflected light does not enter the upper camera 3, thus causing it to observe a dark half moon shape. Then, the solder shape of the left side is judged good. Since the light irradiated on the raised horn-shaped solder fillet H on the right side is reflected upwardly, part of the top is observed as being extremely bright, so the solder condition is judged to be defective. In a like manner, the top of the hump-shaped solder fillet H on the right side shown in (b) of FIG. 2 is partially observed as being extremely bright, so the solder condition is judged as being defective.

In the case of poor-wetting of the solder H (the solder H does not adhere to the circuit board 2) on the right side of the electronic device ((c) of the FIG. 2), all of the light irradiated from above is reflected back from the entire surface of the solder H, so all the top of the device is observed as bright. In (d) of FIG. 2, the electronic device is lifted by the tension generated during the hardening of the solder H. Hence, apart of the solder H is observed as a thin half-moon shape or a straight line. As shown in (e) of FIG. 2, when one of the three leads of a miniaturized transistor is poor-wetting (or not electronically connected to the circuit board through the solder H), the solder H is observed as bright or slightly bright.

When an electronic device such as a QFP having leads L is observed by one of the side cameras 4 while the upper light source 5 is on, images of the leads L appear slightly bright as shown in (f) of FIG. 2. When an electronic device such as a PLCC (Plastic Leaded Chip Carrier) having leads L bent in a J shape is observed by one of the side cameras 4 while the at least one of the side light sources 6 is on, a slightly bright area in a dark colored area, and a bright area are observed. As described above, the solder condition can be judged as either passing or failing from images obtained from the cameras 3 and 4 while switching the light sources 5 and 6.

This apparatus is capable of performing various inspections by selectively switching the cameras 3 and 4 and the light sources 5 and 6 as described above. By applying the technique described in the above-mentioned Japanese patent publication, this apparatus is also capable of inspecting for other conditions such as raised or shifted conditions of electronic devices and also reversed or missing electronic devices.

Figure 4A:
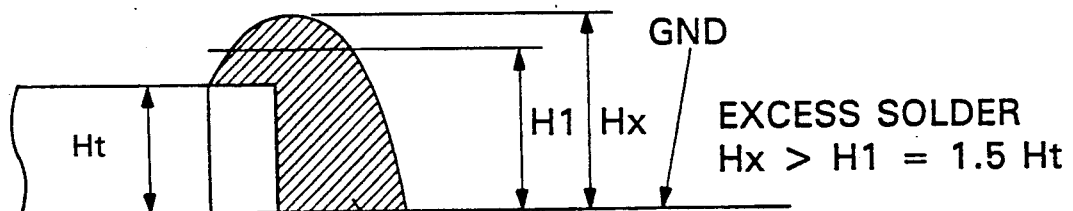
FIGS. 4a, 4b and 4c shows diagrammatically defects of solder fillets.
Figure 4B:
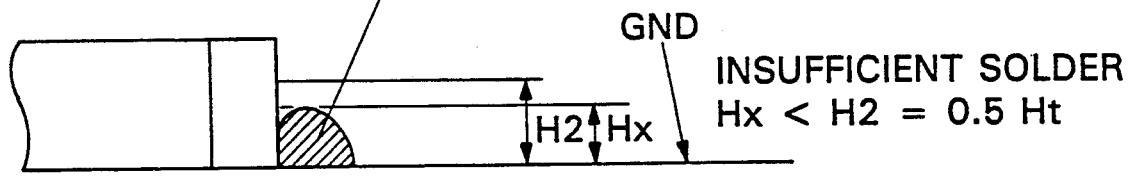
Figure 4C:
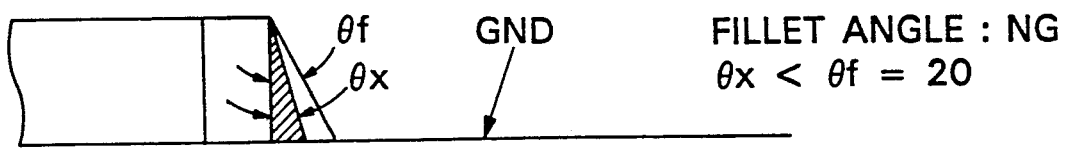

FIGS. 4a, 4b, and 4c show diagrammatically the solder shape measured by scanning the laser beam emitted from the laser device 7 along the solder fillet H formed for soldering the capacitor P2. In this case, the top surface of the substrate 2 is used as the reference plane GND, and the height Hx of the solder fillet H is measured. An excess or lack of solder is judged by comparing the height Hx with the height Ht of the capacitor P2. A certain ratio (e.g., 1.5 times) to the height Ht of the capacitor P2 is set as the upper limit height H1, and another certain ratio (e.g., 0.5 times) to the height Ht is set as the lower limit height H2. The height Ht and these ratios are previously stored in a memory (not shown) of the control unit 10. When the ratio of the measured height Hx to the height Ht exceeds the upper limit, the capacitor P2 is judged as having too much solder FIG. 4a. In contrast, when the ratio of the measured height Hx to the height Ht exceeds the lower limit, the capacitor P2 is judged as having too little solder FIG. 4b. Furthermore, the value of the normal fillet angle $\theta f$ (e.g., 20 deg.) of the capacitor P2 may be previously stored in the memory of the control unit 10. In this case, the control unit 10 calculates the fillet angle $\theta x$ from the obtained height data of various portion of the solder fillet H. If the fillet angle $\theta x$ is less than the normal fillet angle $\theta f$, the solder fillet H of the capacitor P2 is judged as being too thin.

The accuracy of the height of the reference plane GND is extremely important in measuring solder shape. That is, the circuit board 2 is often warped so that the height of the top surface of the circuit board 2 may differ from place to place. Therefore, before measuring the shape of the solder fillet H of an electronic device, the height of the circuit board 2 is obtained by using the combination of the laser device 7 and the optical sensors 8 at three arbitrary points Q1, Q2 and Q3 (FIG. 1) in the vicinity of the electronic device to be inspected, and the plane to be used as the reference plane GND is calculated using the following equation:

$$\begin{pmatrix} a \\ b \\ c \end{pmatrix} = - \begin{pmatrix} X_1 & Y_1 & Z_1 \\ X_2 & Y_2 & Z_2 \\ X_3 & Y_3 & Z_3 \end{pmatrix}^{-1} \begin{pmatrix} 1 \\ 1 \\ 1 \end{pmatrix}$$

where $X_1$ to $Z_3$ are coordinates of the points Q1, Q2 and Q3, respectively. From this, a, b and c are calculated to establish the following planar equation, and the correction value is applied to each of the measured heights of the solder fillet H.

Planar equation: $ax + by + cz + 1 = 0$

Height correction value: $z = -(1 + ax + by)/c$

Where x, y, and z are coordinates of the point to be inspected. By this, a sufficiently accurate height for the reference plane GND can be obtained to satisfy generally required tolerances.

Figure 5:
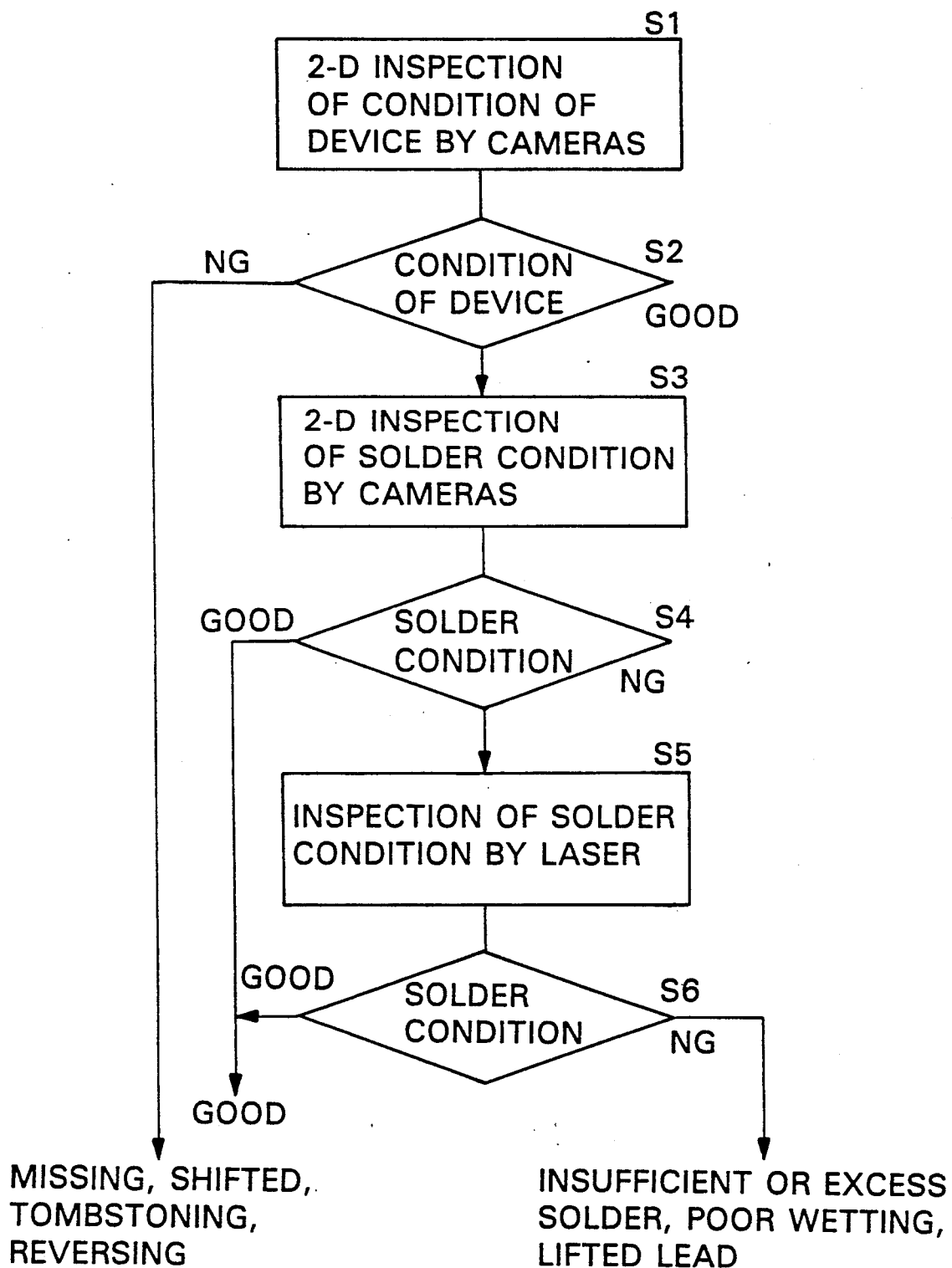
FIG. 5 is a flowchart of the operation of the apparatus of FIG. 1.

The flow of the inspection will be described with reference to FIG. 5. First, the condition of an electronic device is two-dimensionally inspected by the cameras 3 and 4 (step S1), and it is determined whether or not the device to be inspected is missing, shifted, lifted, pointing in the wrong direction, or reversed (step S2). Thereafter, if the result is passing ("GOOD"), then the solder condition is inspected two-dimensionally by the cameras 3 and 4 (step S3). Then, in step S4, the solder condition of the device to be inspected is judged. When the solder condition is judged as not passing ("NG"), a precise measurement of the solder shape of the device to be inspected is performed by the laser device 7 and optical sensors 8 (step S5), and judged if there is insufficient or excess solder, if there is poor-wetting or if the leads are raised (step S6).

In this way, rough inspections are performed first by means of the cameras 3 and 4 which can rapidly perform the inspection, and then only failing devices are inspected by means of the laser device 7 and optical sensors 8 which is capable of precisely measuring the solder shape. Therefore, visual inspection for various items is performed at an overall faster rate while maintaining the required inspection level.

According to the embodiment described above, fast, accurate visual inspection of electronic devices mounted on a circuit board can be performed while the advantages of the cameras and the laser device and position detection device using an optical sensor are utilized to compensate for their respective disadvantages. The position of the upper camera 3 is not restricted to that which is perpendicularly above an electronic device to be inspected, and may be slightly shifted.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In an apparatus for inspecting electronic devices mounted on a circuit board, said apparatus comprises:
    camera means for forming an image of a view of an electronic device to be inspected;
    laser light means for emitting laser light toward said device to be inspected, said laser light means including a reflecting means for adjusting the angle of the emitted laser light;
    laser detection means for detecting a laser beam reflected from said device to be inspected; and
    control means for inspecting the condition of said mounted device to be inspected on said circuit board based on data obtained from said camera means and said laser detection means.

2. In an apparatus for inspecting electronic devices mounted on a circuit board, said apparatus comprises:
    first camera means for forming an image of the top view of an electronic device to be inspected;
    at least one second camera means each for forming an image of a side view of said device to be inspected;
    laser light means for emitting laser light toward said device to be inspected, said laser light means including a reflecting means for adjusting the angle of the emitted laser light;
    laser detection means for detecting the height of at least one portion of said device to be inspected, on the basis of a laser beam reflected from said device to be inspected; and
    control means for inspecting the condition of said mounted device to be inspected on said circuit board based on data obtained from said first and second camera means and said laser detection means.

3. An apparatus according to claim 2, wherein said laser light means emits laser light at least toward one or more solder portions where said device to be inspected is soldered to said circuit board, and said laser detection means detects the height of at least one portion of said solder portions.

4. In an apparatus for inspecting electronic devices mounted on a circuit board, said apparatus comprises:
    first camera means for forming an image of the top view of an electronic device to be inspected, said first camera means being positioned perpendicularly above said device to be inspected;

at least one second camera means each for forming an image of a side view of said device to be inspected, said second camera means being disposed diagonally above said device to be inspected;

laser light means for emitting laser light toward said device to be inspected, said laser light means including a reflecting means for adjusting the angle of the emitted laser light;

laser detection means for detecting the height of at least one portion of said device to be inspected, on the basic of a laser beam reflected from said device to be inspected; and control means for inspecting the condition of said mounted device to be inspected on said circuit board based on data obtained from said first and second camera means and said laser detection means.

5. An apparatus according to claim 4, wherein said laser light means emits laser light at least toward one or more solder portions where said device to be inspected is soldered to said circuit board, and said laser detection means detects the height of at least one portion of said solder portions.

6. An apparatus according to claim 4, wherein the combination of said laser light means, laser detection means and control means functions as said height correction means.

* * * * *